(12) United States Patent
Xu

(10) Patent No.: US 10,290,578 B2
(45) Date of Patent: May 14, 2019

(54) REDUCING TIP-TO-TIP DISTANCE BETWEEN END PORTIONS OF METAL LINES FORMED IN AN INTERCONNECT LAYER OF AN INTEGRATED CIRCUIT (IC)

(71) Applicant: QUALCOMM Incorporated, San Diego, CA (US)

(72) Inventor: Jeffrey Junhao Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/825,231

(22) Filed: Nov. 29, 2017

(65) Prior Publication Data

US 2018/0204794 A1    Jul. 19, 2018

Related U.S. Application Data

(60) Provisional application No. 62/448,059, filed on Jan. 19, 2017.

(51) Int. Cl.
*H01L 23/528* (2006.01)
*H01L 23/532* (2006.01)
(Continued)

(52) U.S. Cl.
CPC ...... *H01L 23/528* (2013.01); *H01L 21/76816* (2013.01); *H01L 21/76877* (2013.01);
(Continued)

(58) Field of Classification Search
CPC .................................................. H01L 23/528
See application file for complete search history.

(56) References Cited

U.S. PATENT DOCUMENTS 7,413,981 B2    8/2008   Tang et al.
8,669,180 B1    3/2014   Lee et al.
(Continued)

FOREIGN PATENT DOCUMENTS

EP       3288064 A1       2/2018
WO    2016209580 A1     12/2016

OTHER PUBLICATIONS

International Search Report and Written Opinion for PCT/US2017/063937, dated Mar. 29, 2018, 14 pages.
(Continued)

*Primary Examiner* — Marvin Payen
(74) *Attorney, Agent, or Firm* — W&T/Qualcomm

(57) ABSTRACT

Aspects for reducing tip-to-tip distance between end portions of metal lines formed in an interconnect layer of an integrated circuit (IC) are provided. In one aspect, a method includes exposing a photoresist layer disposed over a hardmask layer to a light to form a metal line pattern on the photoresist layer. The metal line pattern includes metal line templates corresponding to tracks substantially parallel to an axis. The sections of the photoresist layer corresponding to the metal line pattern are removed to expose the hardmask layer according to the metal line pattern. The exposed portions of the hardmask layer are etched such that trenches are formed corresponding to the metal line pattern. The hardmask layer is directionally etched such that at least one trench is extended in a first direction along the axis. This allows the trenches to be spaced with a reduced pitch and reduced tip-to-tip distance.

14 Claims, 13 Drawing Sheets

(51) Int. Cl.
  *H01L 31/09* (2006.01)
  *H01L 21/768* (2006.01)
  *H01L 23/50* (2006.01)

(52) U.S. Cl.
  CPC ........ *H01L 23/50* (2013.01); *H01L 23/53209* (2013.01); *H01L 31/09* (2013.01)

(56) References Cited

U.S. PATENT DOCUMENTS

| | | |
|---|---|---|
| 9,048,299 B2 | 6/2015 | Ting et al. |
| 9,157,980 B2 | 10/2015 | Dyer et al. |
| 9,312,204 B2 | 4/2016 | Clarke et al. |
| 2014/0357080 A1 | 12/2014 | Lisi et al. |
| 2016/0372414 A1 | 12/2016 | Song et al. |

OTHER PUBLICATIONS

Second Written Opinion for PCT/US2017/063937, dated Jan. 3, 2019, 5 pages.

REDUCING TIP-TO-TIP DISTANCE BETWEEN END PORTIONS OF METAL LINES FORMED IN AN INTERCONNECT LAYER OF AN INTEGRATED CIRCUIT (IC)

PRIORITY CLAIM

The present application claims priority under 35 U.S.C. § 119(e) to U.S. Provisional Patent Application Ser. No. 62/448,059, filed on Jan. 19, 2017 and entitled "REDUCING TIP-TO-TIP DISTANCE BETWEEN END PORTIONS OF METAL LINES FORMED IN AN INTERCONNECT LAYER OF AN INTEGRATED CIRCUIT (IC)," the contents of which is incorporated herein by reference in its entirety.

BACKGROUND

I. Field of the Disclosure

The technology of the disclosure relates generally to use of lithography in fabrication of integrated circuit (ICs) and, more particularly, to forming metal lines according to metal line patterns in interconnect layers of an IC to form interconnections therein.

II. Background

Lithography plays a critical role in the fabrication of integrated circuits (ICs) used in modern electronic devices. In particular, IC fabrication involves employing a variety of chemical and physical lithographic processes to fabricate device structures and interconnecting wires or metal lines in the form of wire patterns. For example, transistors in an IC are conventionally formed by depositing conductive and insulating materials on a semiconductor substrate, and etching the materials to create corresponding transistor structures and wiring patterns. Fabricating structures using such lithographic processes allows millions of transistors to be formed and interconnected to create the complex ICs found in modern electronic devices.

To meet the demand of modern electronic devices for increased functionality while consuming less area, device structures within ICs are being fabricated with smaller feature sizes. One way to fabricate smaller device structures is to form components having interconnect layers that include metal lines with a reduced pitch. For example, a device structure includes multiple interconnect layers, such as metal layers, each of which has multiple metal lines running in a uniform direction. The metal lines of each interconnect layer are deposited with a particular pitch using a patterning scheme, such as self-aligned quadruple patterning (SAQP), and then cut to form a designed pattern. Depositing the metal lines with a relatively smaller pitch limits the area of a corresponding interconnect layer. Smaller interconnect layers help to limit the overall area of the IC.

Depositing the metal layers of an IC with a smaller pitch to limit area introduces additional complexity. For example, forming metal lines to have a particular pattern conventionally involves disposing a cut pattern layer over the deposited metal lines, and etching (e.g., cutting) the metal lines according to the cut pattern layer. Conventional lithographic processes deposit the cut pattern layer within a margin of error of the desired location referred to as the edge placement error (EPE). However, as the pitch of the metal lines decreases, the space between metal lines is reduced. For example, a metal line pitch that is less than thirty (30) nanometers (nm) can result in metal lines that are separated by less than fifteen (15) nm. Such little separation between the metal lines can create a reduced tolerance for EPE, because a reduced metal line pitch increases the risk that a deposited cut pattern layer may result in erroneous cuts to certain metal lines attributable to EPE. Additionally, although conventional processes can correspond to a metal line pitch that is less than thirty (30) nm so as to consume less area, a tip-to-tip distance between end portions of neighboring cut metal lines is limited by the resolution of the cut pattern layer, thus limiting area reduction.

SUMMARY OF THE DISCLOSURE

Aspects disclosed herein include reducing tip-to-tip distance between end portions of metal lines formed in an interconnect layer of an integrated circuit (IC). One way to limit or reduce the area of an IC is to fabricate interconnect layers of the IC with metal lines having a reduced pitch and a reduced tip-to-tip distance. Fabricating the interconnect layers conventionally includes removing portions of the metal lines according to a cut layer pattern to form a metal line pattern. However, interconnect layers having metal lines with a reduced pitch may be susceptible to erroneous metal line patterns due to edge placement error (EPE) of the cut pattern layer. In particular, the cut pattern layer can include an opening designed to expose portions of the metal lines to be removed. EPE may cause the placement of the cut pattern layer to be shifted such that the opening erroneously overlaps particular portions of the metal lines, which causes those portions to be erroneously removed. Further, the tip-to-tip distance between metal lines is limited by the resolution of the metal line cut, thus limiting area reduction.

In this manner, in one aspect, a method is described that reduces the tip-to-tip distance between end portions of metal lines formed in an interconnect layer of an IC. In particular, the method includes exposing a photoresist layer disposed over a hardmask layer to a light so as to form a metal line pattern on the photoresist layer. The metal line pattern includes multiple metal line templates corresponding to tracks that are substantially parallel to an axis. The sections of the photoresist layer corresponding to the metal line pattern are removed to expose the hardmask layer according to the metal line pattern. Additionally, the exposed portions of the hardmask layer are etched such that trenches are formed in the hardmask layer corresponding to the metal line pattern. After removing the photoresist layer, the hardmask layer is directionally etched such that at least one trench is extended in a first direction along the axis. Forming and extending the trenches in this manner allows the trenches to be spaced with a reduced pitch, as well as a reduced tip-to-tip distance. Thus, metal lines disposed in the trenches will have the reduced pitch and reduced tip-to-tip distance so as to achieve an interconnect layer with reduced area consumption.

In this regard in one aspect, a method for forming metal line patterns in an interconnect layer of an IC is provided. The method includes exposing a photoresist layer disposed over a hardmask layer to a light provided by a light source to form a metal line pattern on the photoresist layer. The metal line pattern includes a plurality of metal line templates corresponding to a plurality of tracks each substantially parallel to an axis. The method further includes removing one or more sections of the photoresist layer corresponding to the metal line pattern such that the hardmask layer is exposed according to the metal line pattern. The method further includes etching the hardmask layer corresponding to the metal line pattern to form a plurality of trenches in the hardmask layer corresponding to the plurality of metal line templates in the metal line pattern. The method further includes removing the photoresist layer. The method further includes directionally etching the hardmask layer adjacent to a first end portion of at least one trench to extend a length of the at least one trench in a first direction along the axis.

In another aspect, an IC is provided. The IC includes one or more interconnect layers. Each interconnect layer of the one or more interconnect layers includes a plurality of extreme ultra-violet (EUV) exposure formed metal lines corresponding to a plurality of tracks and formed with a defined pitch. A tip of a metal line corresponding to a track is separated from a tip of another metal line corresponding to the track by a distance that is less than one-half of the defined pitch.

In another aspect, another method for forming metal line patterns in an interconnect layer of an IC is provided. The method includes exposing a photoresist layer disposed over a hardmask layer to a light provided by a light source to form a metal line pattern on the photoresist layer. The metal line pattern includes a plurality of metal line templates corresponding to a plurality of tracks each substantially parallel to an axis. The method further includes removing one or more sections of the photoresist layer corresponding to the metal line pattern such that the hardmask layer is exposed according to the metal line pattern. The method further includes directionally etching at least one metal line template of the plurality of metal line templates of the photoresist layer to extend a length of the at least one metal line template in a first direction along the axis. The method further includes etching the hardmask layer corresponding to the metal line pattern to form a plurality of trenches in the hardmask layer corresponding to the plurality of metal line templates in the metal line pattern. The method further includes removing the photoresist layer.

In another aspect, another method for forming metal line patterns in an interconnect layer of an IC is provided. The method includes exposing a photoresist layer disposed over a hardmask layer to a light provided by a light source to form a metal line pattern on the photoresist layer. The metal line pattern includes a plurality of metal templates corresponding to a plurality of tracks each substantially parallel to an axis. The method further includes removing one or more sections of the photoresist layer corresponding to the metal line pattern such that the hardmask layer is exposed according to the metal line pattern. The method further includes precluding formation of any dummy metal lines in the metal line pattern. The method further includes removing the photoresist layer.

DETAILED DESCRIPTION

Figure 1:
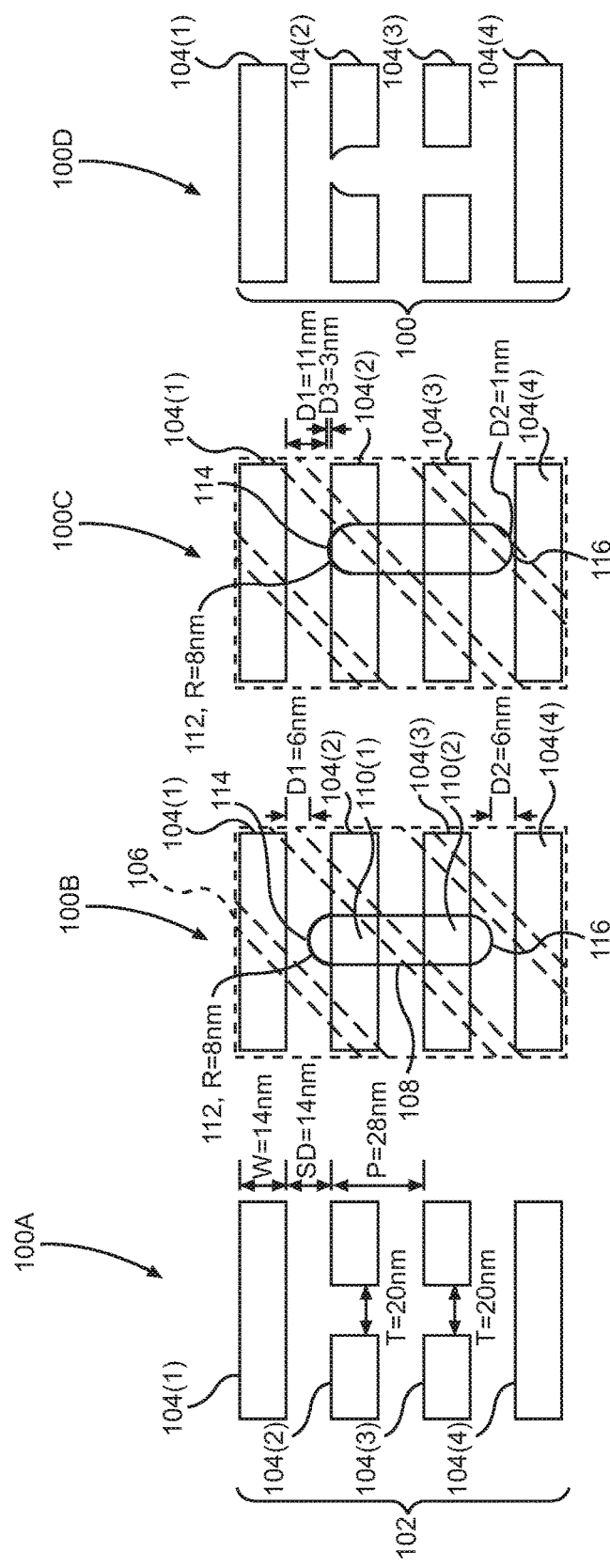
FIG. 1 is a top-view diagram illustrating stages of an exemplary conventional single cut process for forming a metal line pattern.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include reducing tip-to-tip distance between end portions of metal lines formed in an interconnect layer of an integrated circuit (IC). One way to limit or reduce the area of an IC is to fabricate interconnect layers of the IC with metal lines having a reduced pitch and a reduced tip-to-tip distance. Fabricating the interconnect layers conventionally includes removing portions of the metal lines according to a cut layer pattern to form a metal line pattern. However, interconnect layers having metal lines with a reduced pitch may be susceptible to erroneous metal line patterns due to edge placement error (EPE) of the cut pattern layer. In particular, the cut pattern layer can include an opening designed to expose portions of the metal lines to be removed. EPE may cause the placement of the cut pattern layer to be shifted such that the opening erroneously overlaps particular portions of the metal lines, which causes those portions to be erroneously removed. Further, the tip-to-tip distance between metal lines is limited by the resolution of the metal line cut, thus limiting area reduction.

In this manner, in one aspect, a method is described that reduces the tip-to-tip distance between end portions of metal lines in an interconnect layer of an IC. In particular, the method includes exposing a photoresist layer disposed over a hardmask layer to a light so as to form a metal line pattern on the photoresist layer. The metal line pattern includes multiple metal line templates corresponding to tracks that are substantially parallel to an axis. The sections of the photoresist layer corresponding to the metal line pattern are removed to expose the hardmask layer according to the metal line pattern. Additionally, the exposed portions of the hardmask layer are etched such that trenches are formed in the hardmask layer corresponding to the metal line pattern. After removing the photoresist layer, the hardmask layer is directionally etched such that at least one trench is extended in a first direction along the axis. Forming and extending the trenches in this manner allows the trenches to be spaced with a reduced pitch, as well as a reduced tip-to-tip distance. Thus, metal lines disposed in the trenches will have the reduced pitch and reduced tip-to-tip distance so as to achieve an interconnect layer with reduced area consumption.

Before discussing reducing tip-to-tip distance between end portions of metal lines formed in an interconnect layer of an IC in aspects disclosed herein, exemplary conventional processes for forming metal line patterns are first described.

In this regard, FIG. 1 is a top-view diagram illustrating stages 100A-100D of an exemplary conventional single cut process for forming a metal line pattern 100. In particular, the process includes designing a planned metal line pattern 102 in stage 100A. The planned metal line pattern 102 includes metal lines 104(1)-104(4) having a pitch P, which may be twenty-eight (28) nanometers (nm) in this example. The pitch P of the metal lines 104(1)-104(4) factors into the total area of an IC employing an interconnect layer with the planned metal line pattern 102. In this manner, limiting the pitch P of the metal lines 104(1)-104(4) helps to limit the total area of the corresponding IC. Additionally, each of the metal lines 104(1)-104(4) has a width W and is separated from neighboring metal lines of the metal lines 104(1)-104(4) by a separation distance SD. The width W and the separation distance SD in the planned metal line pattern 102 may both be equal to fourteen (14) nm in this example. The planned metal line pattern 102 indicates that metal lines 104(2) and 104(3) are each etched so as to form a tip-to-tip distance T of the metal lines 104(2) and 104(3), which conventionally may be as small as twenty (20) nm.

With continuing reference to FIG. 1, after establishing the planned metal line pattern 102 in stage 100A, the process includes disposing a cut pattern layer 106 over the metal lines 104(1)-104(4) in stage 100B. In this example, the cut pattern layer 106 includes an opening 108 that exposes portions 110(1) and 110(2) of the metal lines 104(2) and 104(3) to be removed by the etching process. The opening 108 has a top-rounded portion 112 with a corner-rounding radius R, which may be eight (8) nm in this example. Additionally, the cut pattern layer 106 is disposed such that a top side 114 of the cut pattern layer 106 is separated from metal line 104(1) by a distance D1, which may be six (6) nm in this example, and a bottom side 116 of the cut pattern layer 106 is separated from metal line 104(4) by a distance D2, which may be 6 nm in this example. The placement of the cut pattern layer 106 in stage 100B illustrates an instance of the process having no EPE. In particular, the cut pattern layer 106 is placed over the metal lines 104(1)-104(4) without any margin of error, such that the opening 108 exposes the portions 110(1) and 110(2) to be etched according to the planned metal line pattern 102 in stage 100A. Thus, etching the metal lines 104(2) and 104(3) based on the placement of the cut pattern layer 106 in stage 100B produces a metal line pattern free of errors attributable to EPE.

However, disposing the cut pattern layer 106 has a high probability of EPE in the conventional process. In this manner, stage 100C illustrates the cut pattern layer 106 disposed with EPE such that the opening 108 does not correctly expose the portions 110(1) and 110(2) to be etched according to the planned metal line pattern 102. In particular, in this example the EPE may be equal to five (5) nm. The EPE of 5 nm results in the cut pattern layer 106 being incorrectly placed such that the top side 114 is separated from the metal line 104(1) by the distance D1 equal to eleven (11) nm, and the bottom side 116 is separated from the metal line 104(4) by the distance D2 equal to one (1) nm. Further, stage 100C illustrates that the EPE of 5 nm causes the top-rounded portion 112 of the opening 108 to overlap the metal line 104(2). More specifically, the top side 114 may be separated from the metal line 104(2) by a distance D3 of three (3) nm in this example, which is not enough separation to compensate for the 8 nm corner-rounding radius R of the top-rounded portion 112.

With continuing reference to FIG. 1, stage 100D illustrates the metal line pattern 100 resulting from etching the metal lines 104(2) and 104(3) based on the cut pattern layer 106 with the EPE in stage 100C. The metal line 104(2) in the metal line pattern 100 differs from the metal line 104(2) in the planned metal line pattern 102, as the metal line 104(2) in the metal line pattern 100 is erroneously cut due to the EPE causing the incorrect placement of the top-rounded portion 112 of the cut pattern layer 106. The erroneous incomplete rounded cut of the metal line 104(2) in the metal line pattern 100 can cause incorrect operation of an IC employing the metal line pattern 100, such as by preventing a contact from being correctly placed over the metal line 104(2), for example.

Figure 2:
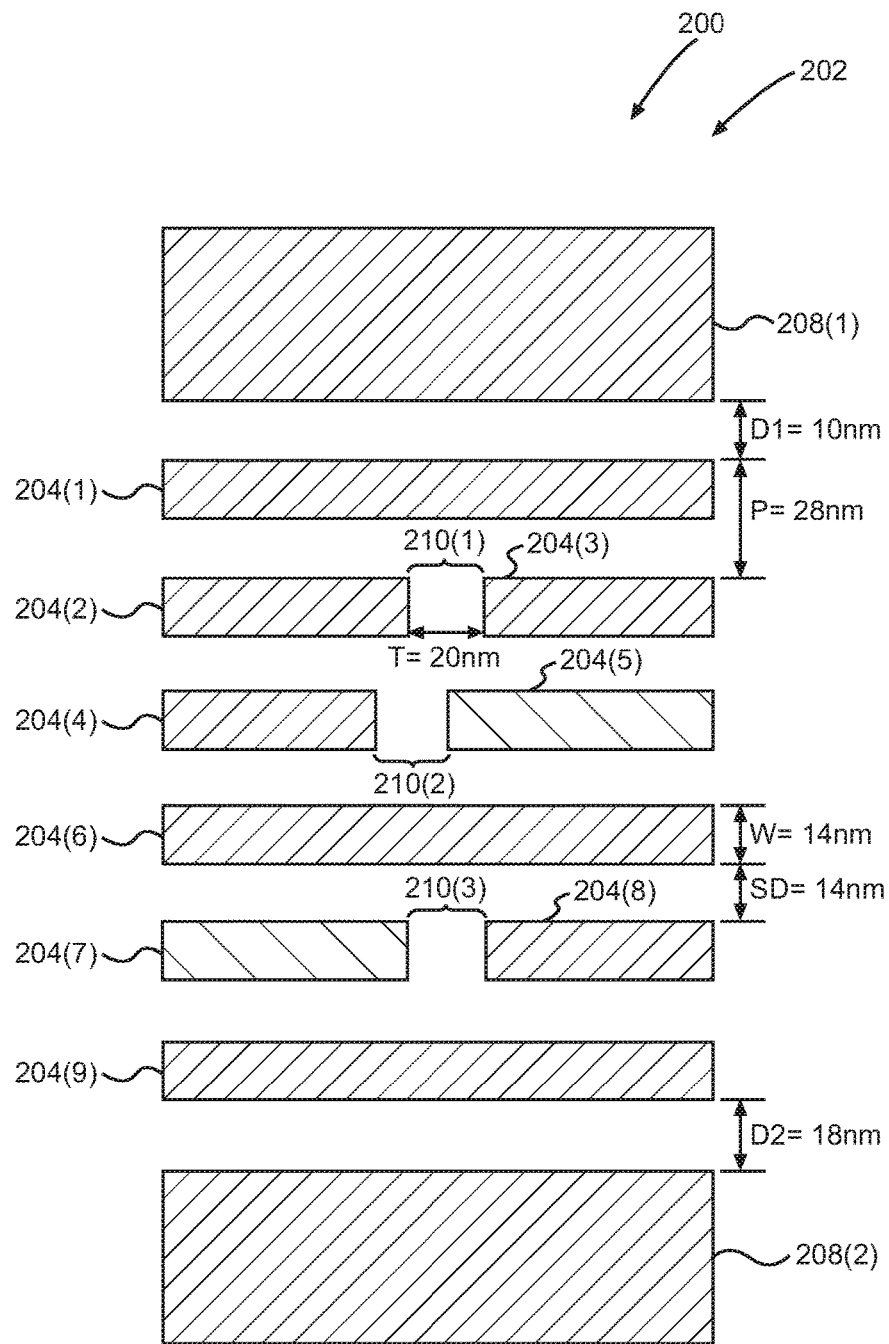
FIG. 2 is a top-view diagram of an exemplary conventional interconnect layer of an integrated circuit (IC) formed using a multiple cut process.

One way to reduce errors attributable to the EPE demonstrated in the single cut process in FIG. 1 is to employ a multiple cut process. In this regard, FIG. 2 is a top-view diagram of an exemplary conventional interconnect layer 200 employed in an IC 202 formed using a multiple cut process. The interconnect layer 200 includes metal lines 204(1)-204(9) having a pitch P, which may be 28 nm in this example. Further, each of the metal lines 204(1)-204(9) has a width W and is separated from neighboring metal lines of the metal lines 204(1)-204(9) by a separation distance SD. The width W and the separation distance SD may both be equal to 14 nm in this example. Additionally, a tip-to-tip distance T of metal lines 204(2) and 204(3), metal lines 204(4) and 204(5), and metal lines 204(7) and 204(8) is approximately equal to twenty (20) nm in this example. Further, the interconnect layer 200 also includes a power rail 208(1) disposed a distance D1 from metal line 204(1), and a power rail 208(2) disposed a distance D2 from metal line 204(9). In this example, the distance D1 is approximately equal to ten (10) nm, and the distance D2 is approximately equal to eighteen (18) nm.

With continuing reference to FIG. 2, the multiple cut process used to form the interconnect layer 200 includes employing the metal lines 204(1), 204(4), 204(5), 204(7), and 204(8) using a first material, while the metal lines 204(2), 204(3), 204(6), and 204(9) are employed using a second material different from the first material. However, disposing the metal lines 204(1)-204(9) using different materials, and thus different disposition steps, can cause inconsistent line spacing. For example, the distance D1 separating the power rail 208(1) from the metal line 204(1) is smaller than the distance D2 separating the power rail 208(2) from the metal line 204(9). Such inconsistent spacing results in erroneous operation of the IC 202, as elements of other interconnect layers are prevented from properly coupling to the interconnect layer 200.

With continuing reference to FIG. 2, the multiple cut process used to form the interconnect layer 200 also employs selective etching that etches the first material while leaving the second material unaltered, and vice versa. In this example, a first stage of selective etching corresponds to forming a space 210(1) between the metal lines 204(2) and 204(3), and a second stage of selective etching corresponds to forming a space 210(2) between the metal lines 204(4) and 204(5). Further, a third stage of selective etching corresponds to forming a space 210(3) between the metal lines 204(7) and 204(8). However, due to the resolution of the cut pattern, the tip-to-tip distance T is conventionally limited to no less than 20 nm, which limits area reduction of the interconnect layer 200. Further, due to misalignment of cut patterns used in the first and second stages of selective etching, the space 210(1) does not align with the space 210(2). Misalignment of the spaces 210(1) and 210(2) may cause erroneous operation of the IC 202 employing the interconnect layer 200, as such alignment issues prevent other interconnect layers of the IC 202 from properly coupling to the interconnect layer 200. Further, although the multiple cut process forms the spaces 210(1), 210(2), and 210(3) as described above, the multiple cut process does not remove dummy metal lines not used by the interconnect layer 200 for circuit operation, such as the metal lines 204(5) and 204(7). The additional metal of the unused metal lines 204(5) and 204(7) (i.e., the dummy metal lines 204(5) and 202(7)) increases the parasitic capacitance of the interconnect layer 200, which limits the frequency at which the IC 202 operates. Thus, although the conventional multiple cut process used to form the interconnect layer 200 reduces the effects of the EPE illustrated in FIG. 1, the multiple cut process causes errors attributable to misalignment, as well as excess parasitic capacitance that limits performance.

Figure 3:
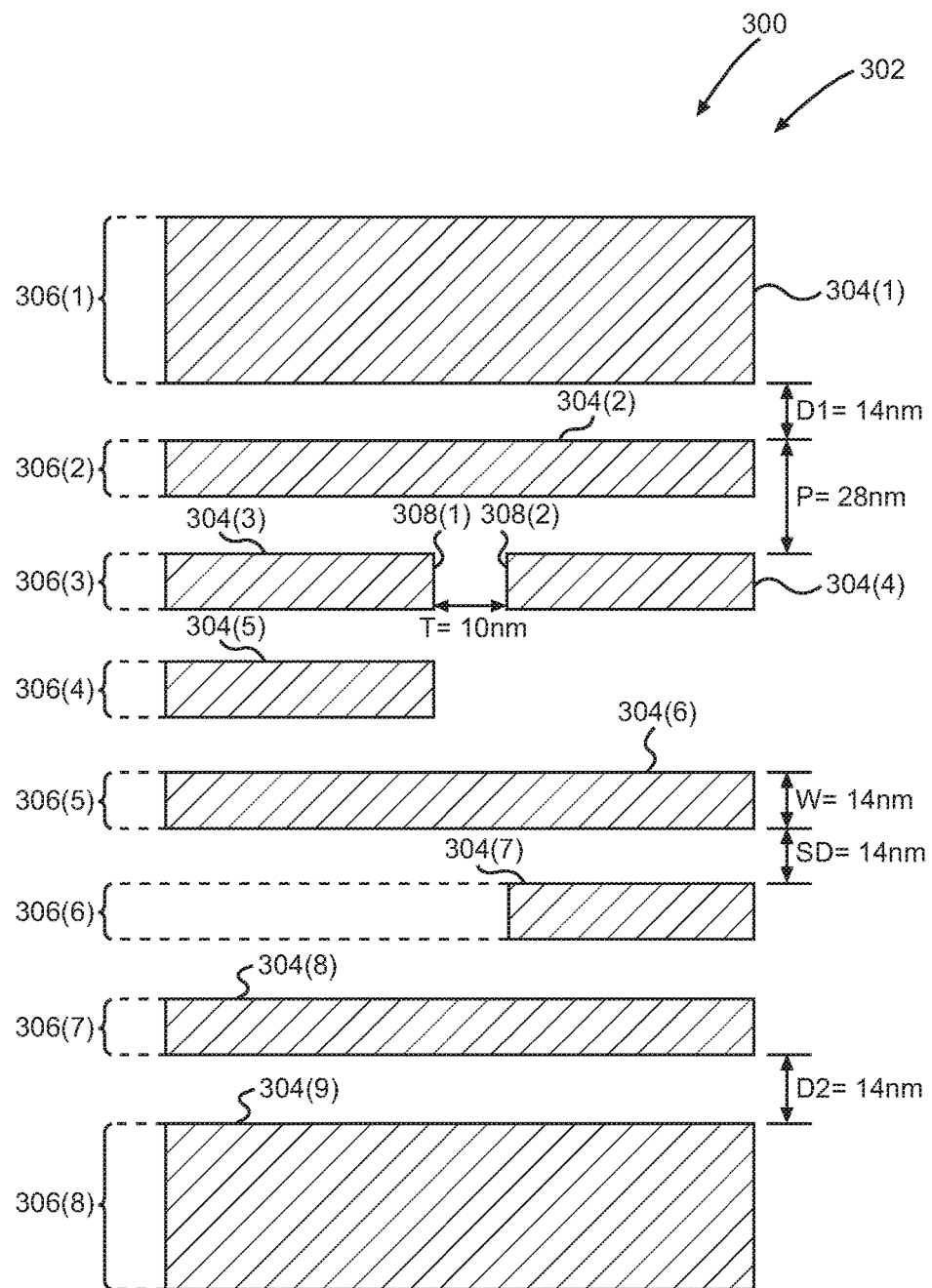
FIG. 3 is a top-view diagram of an exemplary interconnect layer of an IC that includes extreme ultra-violet (EUV) formed metal lines with a reduced tip-to-tip margin.

As discussed in greater detail below, aspects disclosed herein describe reducing tip-to-tip distance between end portions of metal lines formed in an interconnect layer of an IC while mitigating the EPE and misalignment errors generated in the conventional processes in FIGS. 1 and 2. FIG. 3 illustrates a top-view diagram of an interconnect layer 300 employed in an IC 302 generated according to aspects discussed below. The interconnect layer 300 includes metal lines 304(1)-304(9) disposed over corresponding tracks 306(1)-306(8). As discussed in more detail with reference to FIG. 4, the metal lines 304(1)-304(9) may be formed using an extreme ultra-violet (EUV) exposure process (e.g., EUV exposure formed metal lines 304(1)-304(9)). Further, metal lines 304(1) and 304(9) are referred to as power rails 304(1) and 304(9). In this example, the power rail 304(1) is disposed a distance D1 from metal line 304(2), and the power rail 304(9) is disposed a distance D2 from metal line 304(8), wherein the distances D1 and D2 are approximately equal to fourteen (14) nm. Metal lines 304(2)-304(8) are formed with a defined pitch P, have a width W, and are separated from other metal lines of the metal lines 304(2)-304(8) by a separation distance SD. In this example, the defined pitch P is equal to approximately 28 nm, whereas the width W and the separation distance SD are each approximately equal to 14 nm.

With continuing reference to FIG. 3, a tip 308(1) of metal line 304(3) is spaced a tip-to-tip distance T from a tip 308(2) of metal line 304(4). In this aspect, the tip-to-tip distance T is less than one-half of the defined pitch P (i.e., T<(½)*(28 nm), T<14 nm). For example, the tip-to-tip distance T is equal to approximately ten (10) nm. In this manner, the interconnect layer 300 in the IC 302 in FIG. 3 illustrates that aspects disclosed herein can generate interconnect layers at a smaller pitch (e.g., 30 nm or less, such as 28 nm) while reducing or avoiding the errors attributable to EPE or misalignment and achieving a reduced tip-to-tip distance T. The reduced tip-to-tip distance T can result in reduced area of the IC 302, which reduces the area of a corresponding chip. Additionally, the interconnect layer 300 does not include any dummy metal lines that are not used by the IC 302. As used herein, dummy metal lines are metal lines that are not electrically coupled to another metal line, the interconnect layer 300, or an active area in the IC 302. For example, no dummy metal lines are disposed on track 306(3) along with the metal line 304(4) or on track 306(5) along with metal line 304(6). Thus, aspects disclosed herein can also generate interconnect layers with reduced parasitic capacitance, resulting in corresponding ICs with higher performance compared to the conventional processes discussed with reference to FIGS. 1 and 2.

Figure 4:
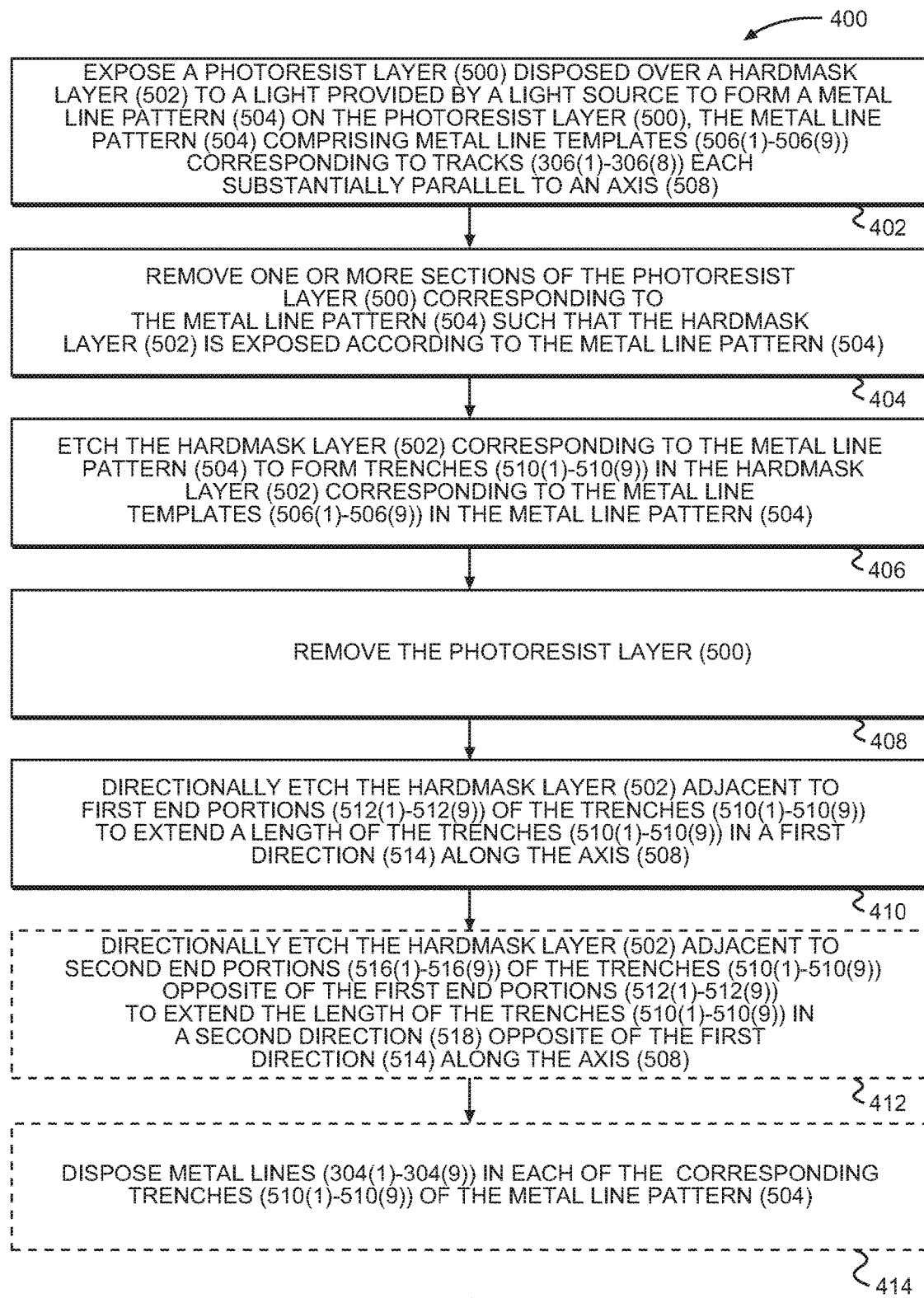
FIG. 4 is a flowchart illustrating an exemplary process for forming metal lines in the interconnect layer of the IC in FIG. 3.

In this regard, FIG. 4 illustrates an exemplary process 400 for forming the metal lines 304(1)-304(9) in the interconnect layer 300 of the IC 302 of FIG. 3. Further, FIGS. 5A-5E provide top-view diagrams illustrating the interconnect layer 300 at each step in the process 400 of FIG. 4. The top-view diagrams illustrating the interconnect layer 300 in FIGS. 5A-5E will be discussed in conjunction with the discussion of the exemplary steps in the process 400 in FIG. 4.

Figure 5A:
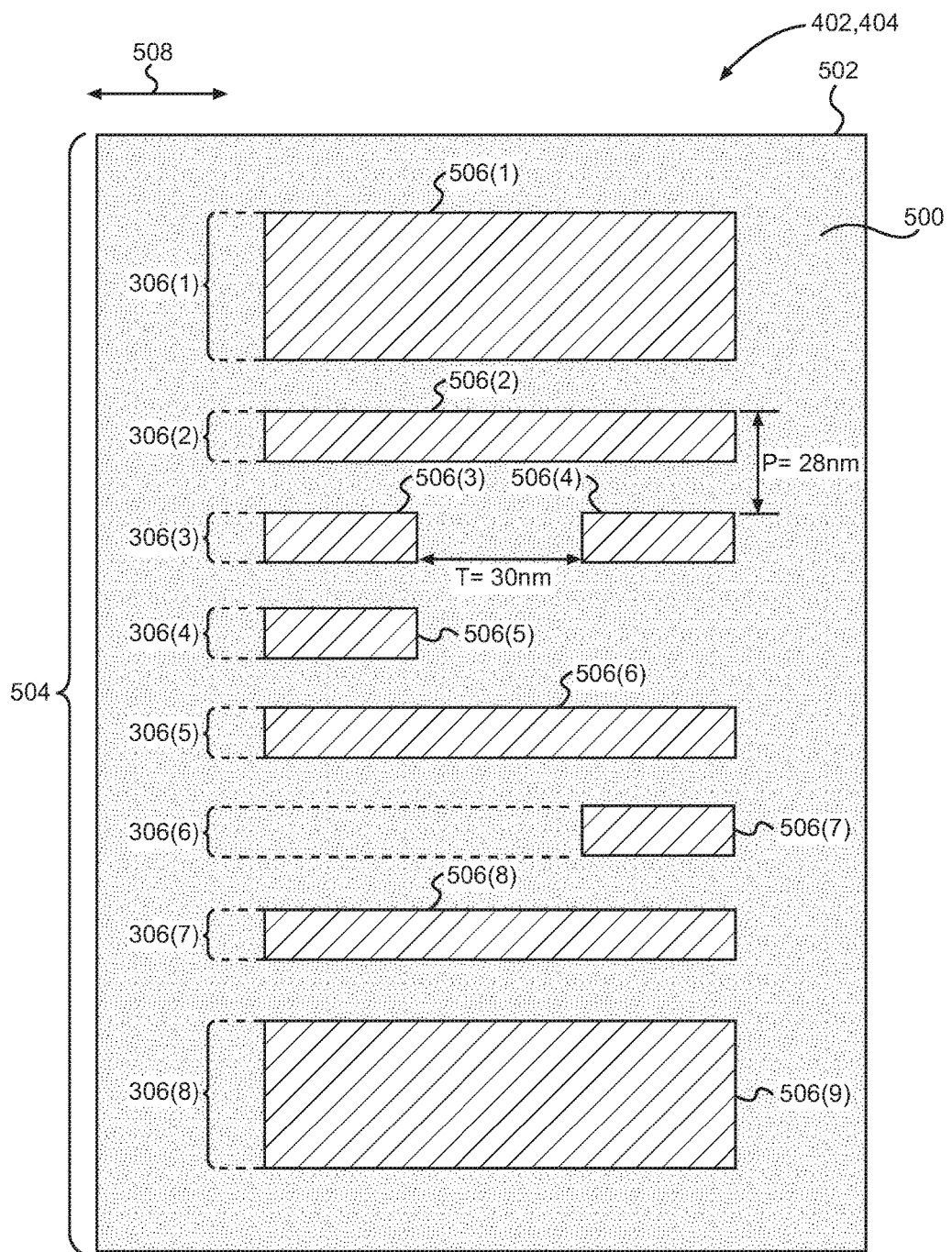
FIGS. 5A-5E are top-view diagrams illustrating the interconnect layer in FIG. 3 at each step in the process of FIG. 4.
Figure 5B:
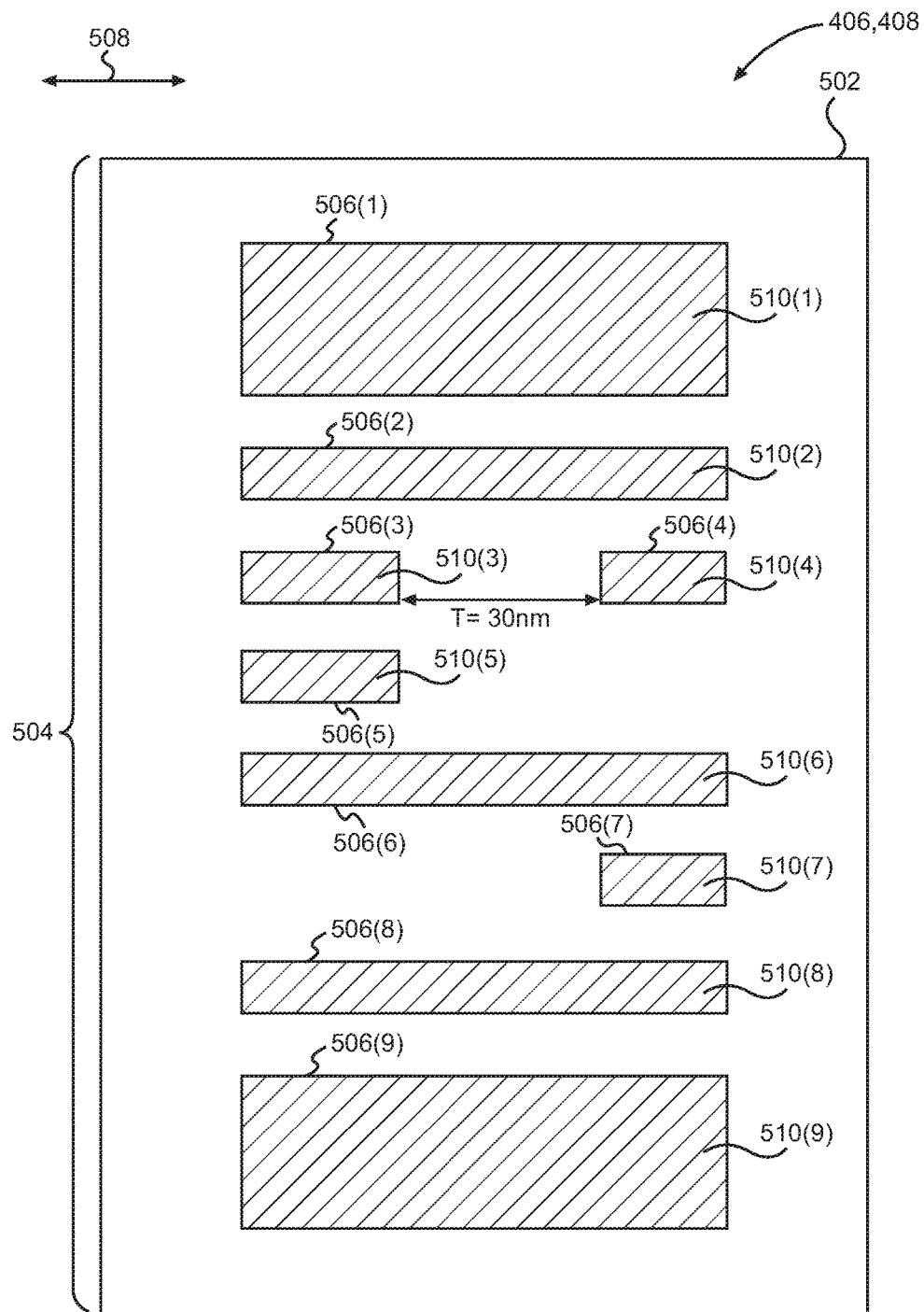

The process 400 includes exposing a photoresist layer 500 disposed over a hardmask layer 502 to a light provided by a light source to form a metal line pattern 504 on the photoresist layer 500 (block 402, FIG. 5A). For example, block 402 can include exposing the photoresist layer 500 to a single exposure of an EUV light provided by an EUV light source. The metal line pattern 504 includes a plurality of metal line templates 506(1)-506(9) corresponding to the tracks 306(1)-306(8), each substantially parallel to an axis 508 (FIG. 5A). In this example, as illustrated in FIG. 5A, the tip-to-tip distance T between metal line templates 506(3) and 506(4) is approximately equal to thirty (30) nm. The process 400 also includes removing one or more sections of the photoresist layer 500 corresponding to the metal line pattern 504 such that the hardmask layer 502 is exposed according to the metal line pattern 504 (block 404, FIG. 5A). The process 400 further includes etching the hardmask layer 502 corresponding to the metal line pattern 504 to form trenches 510(1)-510(9) in the hardmask layer 502 corresponding to the metal line templates 506(1)-506(9) in the metal line pattern 504 (block 406, FIG. 5B). The process 400 also includes removing the photoresist layer 500 (block 408, FIG. 5B).

Figure 5C:
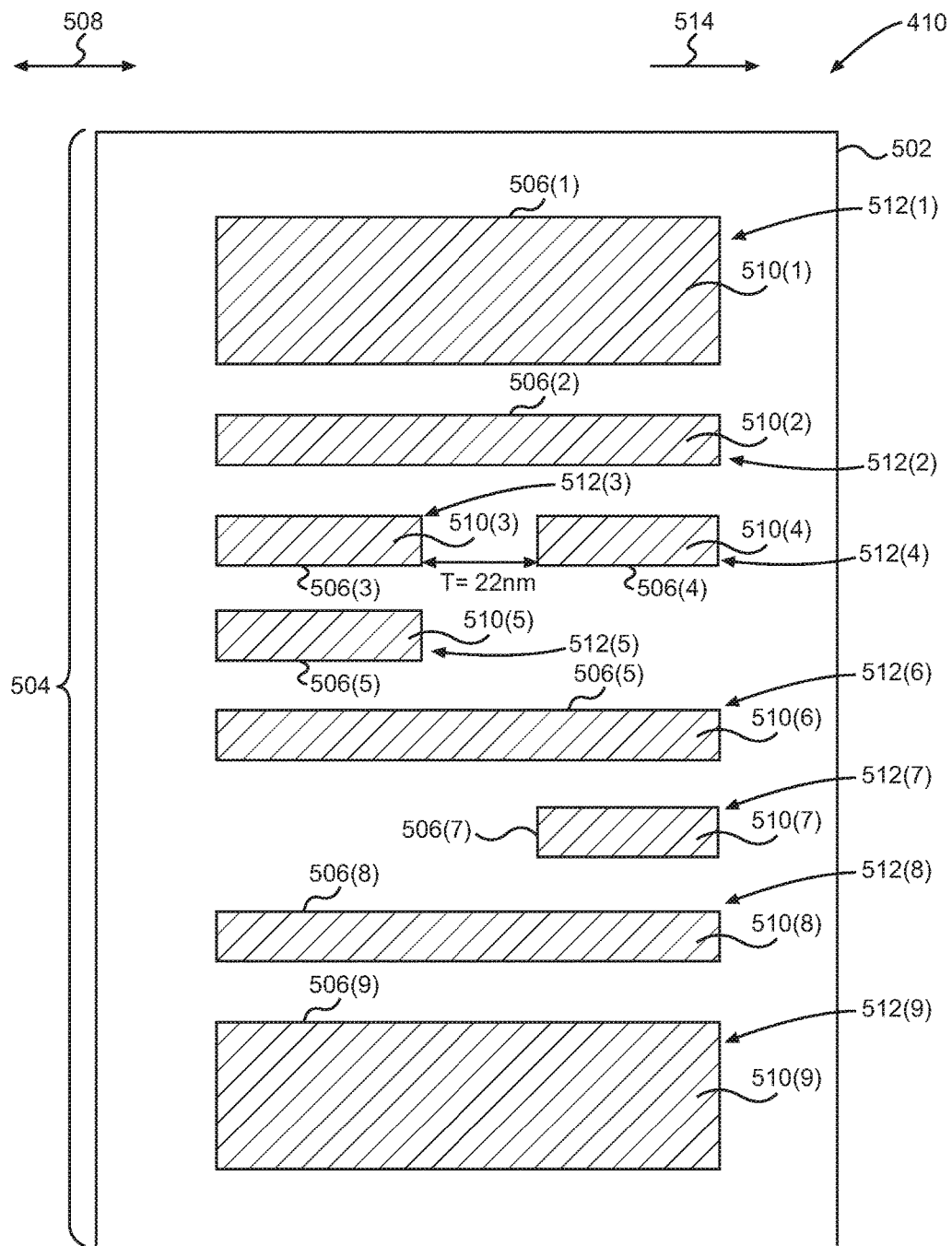
Figure 5D:
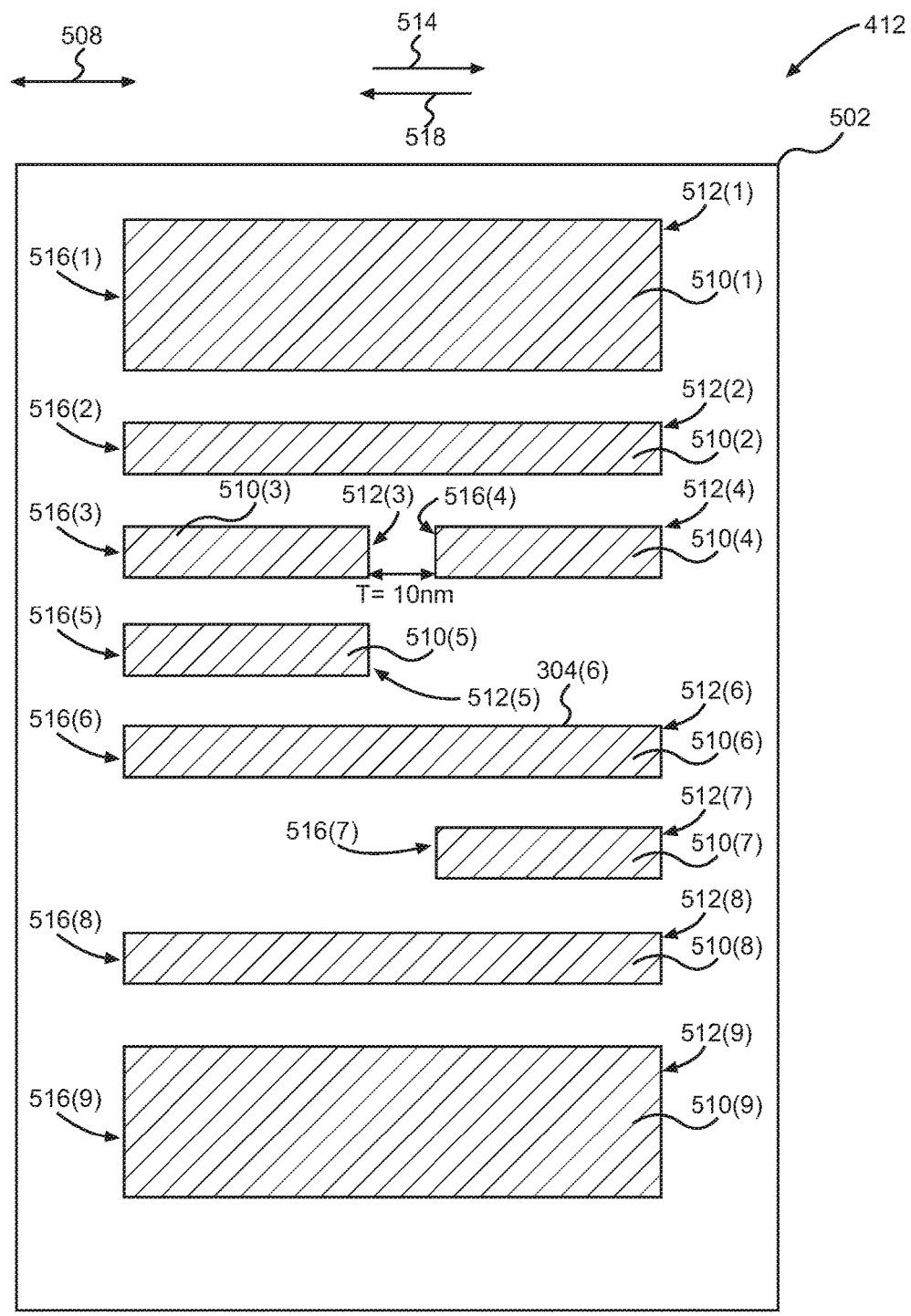
Figure 5E:
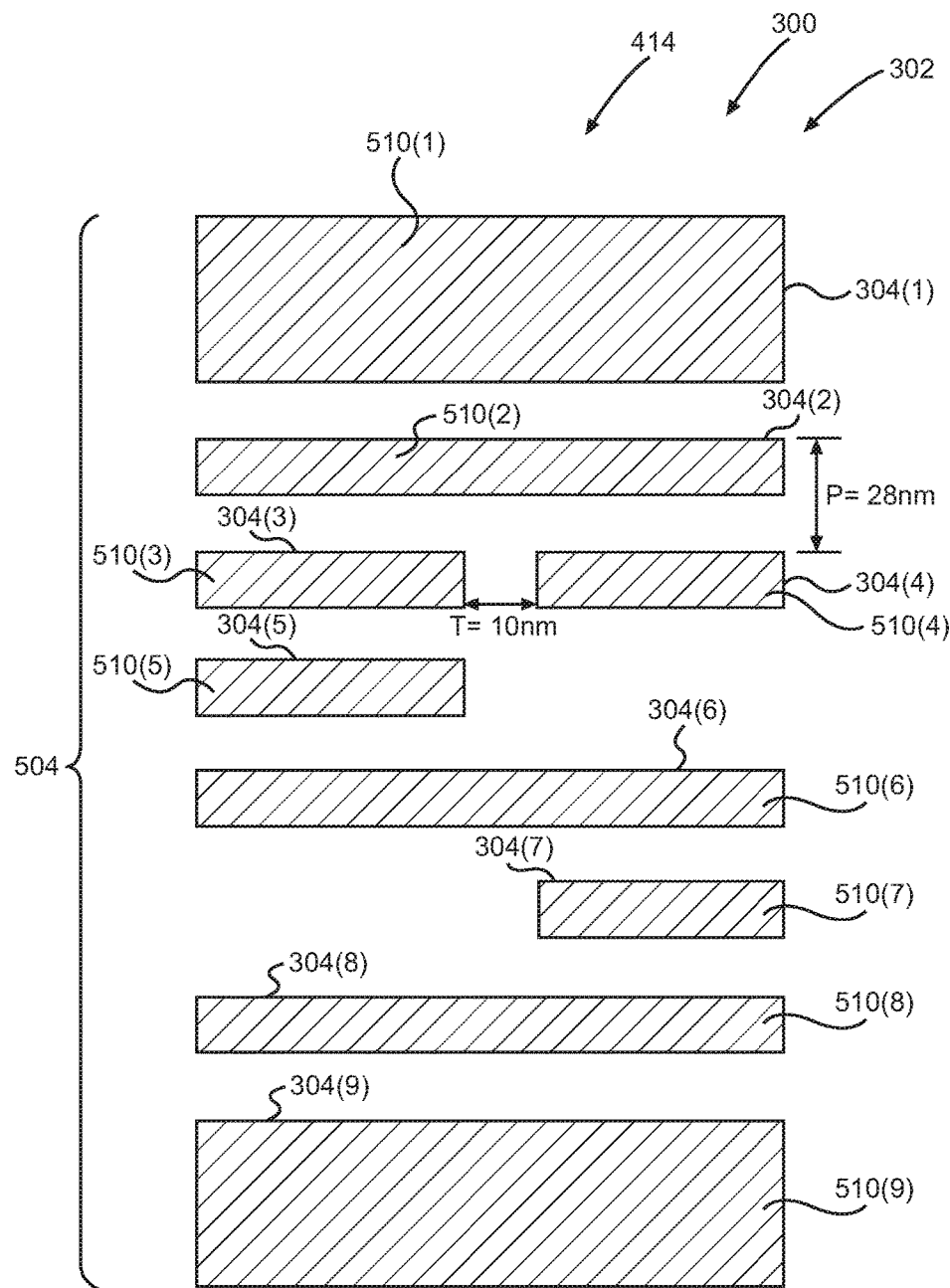

With continuing reference to FIG. 4, because the current tip-to-tip distance T is approximately equal to 30 nm, the process 400 also includes directionally etching the hardmask layer 502 adjacent to first end portions 512(1)-512(9) of the trenches 510(1)-510(9) to extend a length of the trenches 510(1)-510(9) in a first direction 514 along the axis 508 (block 410, FIG. 5C). For example, this can include directionally etching the hardmask layer 502 such that the trenches 510(1)-510(9) are extended in the first direction 514 along the axis 508 such that the tip-to-tip distance T between trench 510(3) and trench 510(4) is reduced. In this manner, the tip-to-tip distance T can be reduced from approximately 30 nm to approximately ten (10) nm using the single direction etching step of block 410. However, the directional etching step in block 410 in this example is configured to reduce the tip-to-tip distance T to approximately twenty-two (22) nm. In this manner, the process 400 can also include directionally etching the hardmask layer 502 adjacent to a second end portions 516(1)-516(9) of each of the trenches 510(1)-510(9) opposite of the first end portions 512(1)-512(9) to extend the length of the trenches 510(1)-510(9) in a second direction 518 opposite of the first direction 514 along the axis 508 such that the tip-to-tip distance T is reduced to 10 nm (block 412, FIG. 5D). Further, the process 400 can include disposing the metal lines 304(1)-304(9) in each of the corresponding trenches 510(1)-510(9) of the metal line pattern 504 to form the interconnect layer 300 (block 414, FIG. 5E). It should be appreciated that once the metal lines 304(1)-304(9) are formed, these metal lines 304(1)-304(9) are used to interconnect active elements within the IC 302.

As noted above, the process 400 also precludes formation of any dummy metal lines in the metal line pattern 504.

While the process 400 in FIG. 4 includes the directional etching steps described in blocks 410 and 412, directional etching may alternatively be performed on the photoresist layer 500. For example, such directional etching may be performed on the photoresist layer 500 using an etching chemistry of oxygen. In particular, in other aspects, the metal line templates 506(1)-506(9) of the photoresist layer 500 may be directionally etched in either the first direction 514 or the second direction 518 such that the tip-to-tip distance T is reduced from approximately 30 nm to approximately 10 nm. In such aspects, the directional etching of blocks 410 and 412 is not performed on the hardmask layer 502, because the tip-to-tip distance T is formed to the desired value when etching the hardmask layer 502 corresponding to the metal line pattern 504 to form the trenches 510(1)-510(9) in block 406.

As still another possible variation, a first directional etching step may be performed in the first direction 514 on the photoresist layer 500, and then a second directional etching step performed in the second direction 518 on the hardmask layer 502.

Figure 6A:
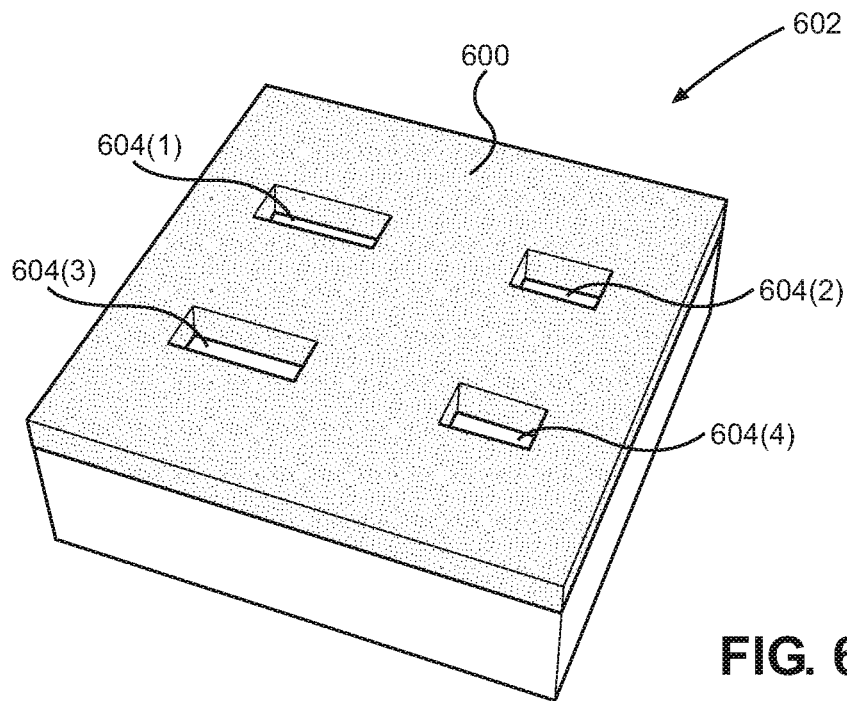
FIGS. 6A-6C are perspective-view diagrams illustrating an exemplary hardmask layer of an exemplary interconnect layer during directional etching process steps.
Figure 6B:
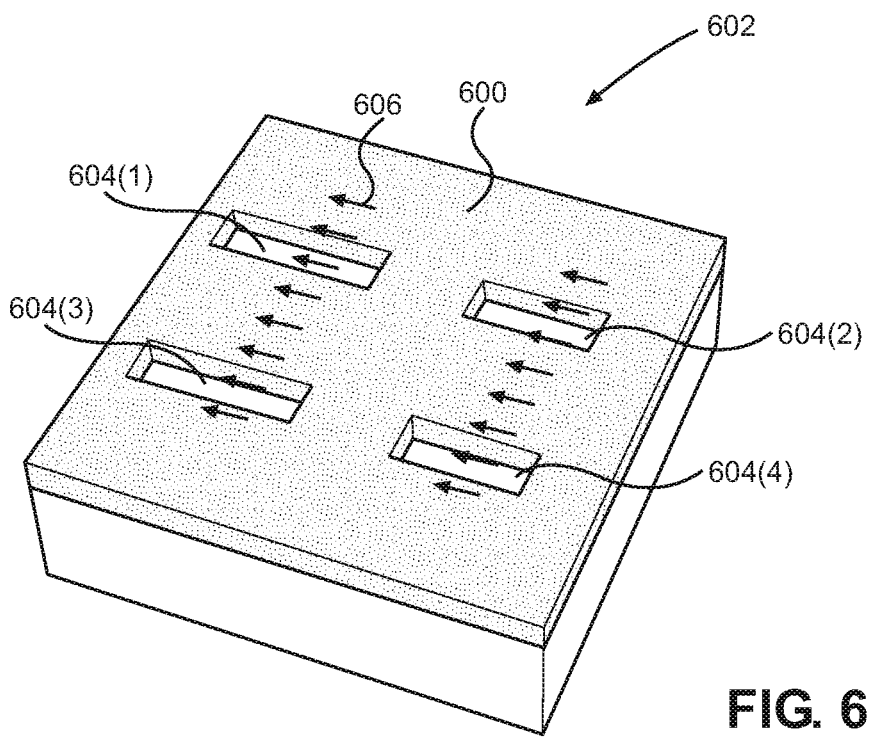
Figure 6C:
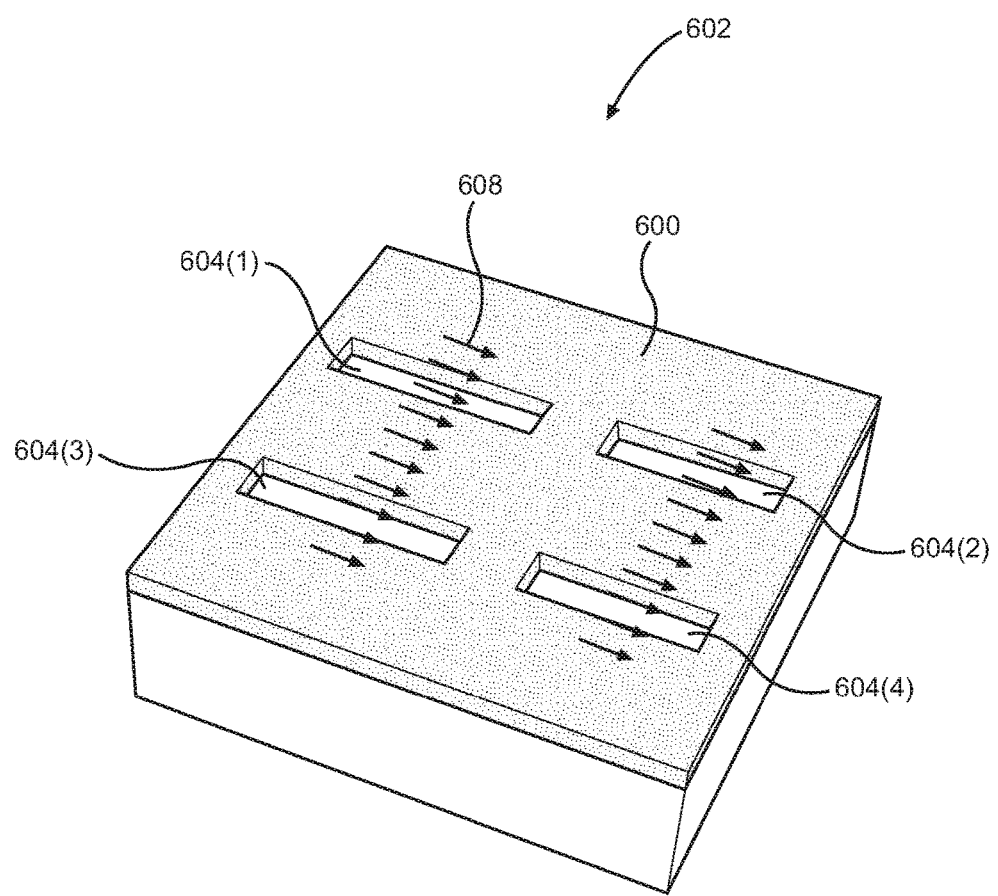

To provide additional detail concerning the directional etching process referenced in blocks 410 and 412 in FIG. 4, FIGS. 6A-6C illustrate perspective-view diagrams of an exemplary hardmask layer 600 of an exemplary interconnect layer 602 during the directional etching process steps. In this regard, FIG. 6A illustrates the hardmask layer 600 following etching of trenches 604(1)-604(4) and removal of a photoresist layer. FIG. 6B illustrates the trenches 604(1)-604(4) following directional etching in a first direction 606 such that the trenches 604(1)-604(4) are extended in the first direction 606 (e.g., from right to left). For example, the trenches 604(1)-604(4) can be extended in the first direction 606 by five (5) to ten (10) nm. FIG. 6C illustrates the trenches 604(1)-604(4) following directional etching in a second direction 608 such that the trenches 604(1)-604(4) are extended in the second direction 608 (e.g., from left to right). For example, the trenches 604(1)-604(4) can be extended in the second direction 608 by 5-10 nm. The directional etching steps illustrated in FIGS. 6B and 6C can be performed using various etch species, such as, but not limited to, directional chemical reactive ion, atomic, or molecular beams with physical sputter etch, chemical etch, or a combination of physical and chemical etch.

Reducing tip-to-tip distance between end portions of metal lines formed in an interconnect layer of an IC according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 7:
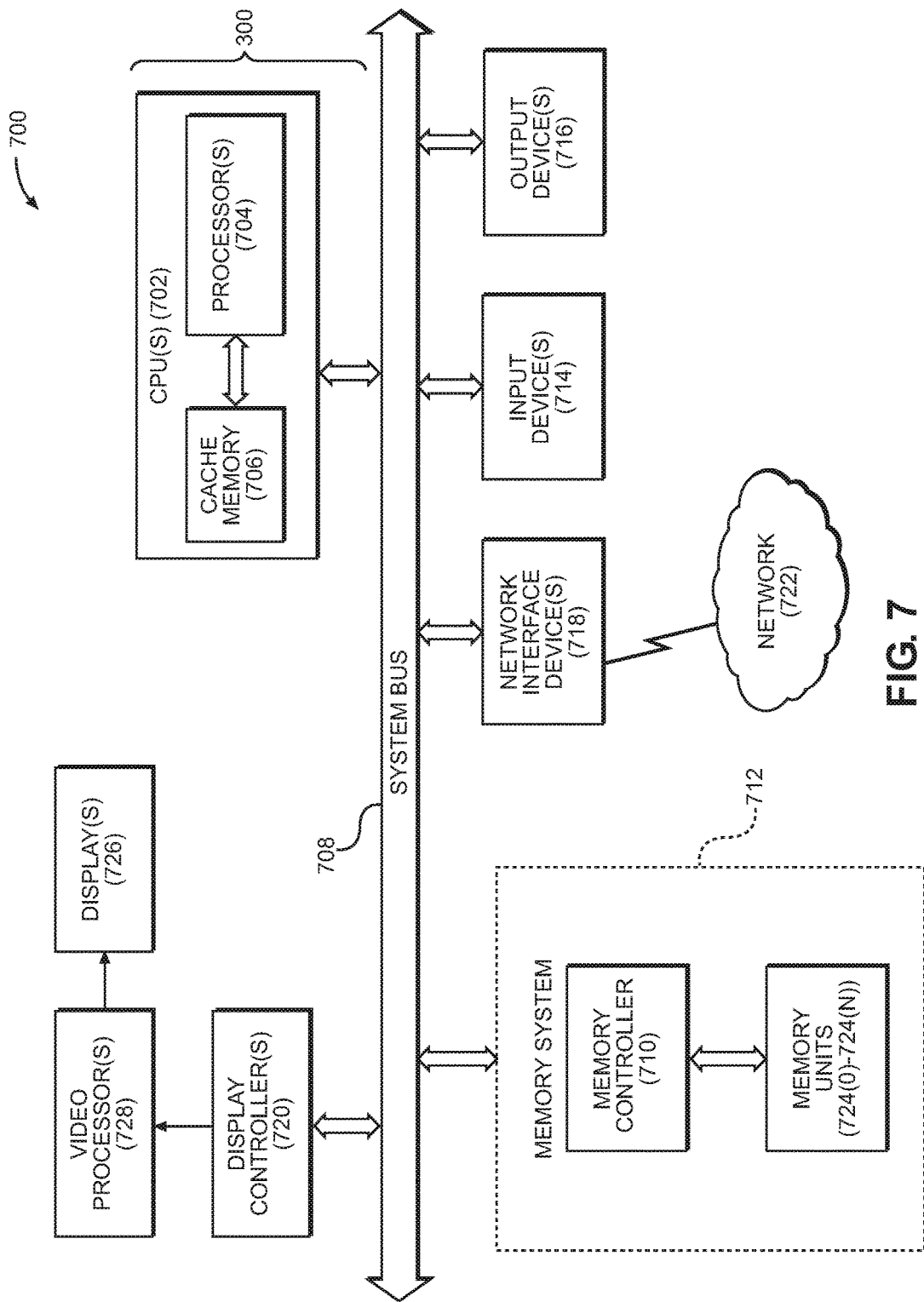
FIG. 7 is a block diagram of an exemplary processor-based system that can include ICs employing the interconnect layer of FIG. 3.

In this regard, FIG. 7 illustrates an example of a processor-based system 700 that can employ ICs employing the interconnect layer 300 illustrated in FIG. 3. In this example, the processor-based system 700 includes one or more central processing units (CPUs) 702, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712, one or more input devices 714, one or more output devices 716, one or more network interface devices 718, and one or more display controllers 720, as examples. The input device(s) 714 can include any type of input device, including, but not limited to, input keys, switches, voice processors, etc. The output device(s) 716 can include any type of output device, including, but not limited to, audio, video, other visual indicators, etc. The network interface device(s) 718 can be any device configured to allow exchange of data to and from a network 722. The network 722 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 718 can be configured to support any type of communications protocol desired. The memory system 712 can include one or more memory units 724(0)-724(N).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, a light emitting diode (LED) display, etc.

Figure 8:
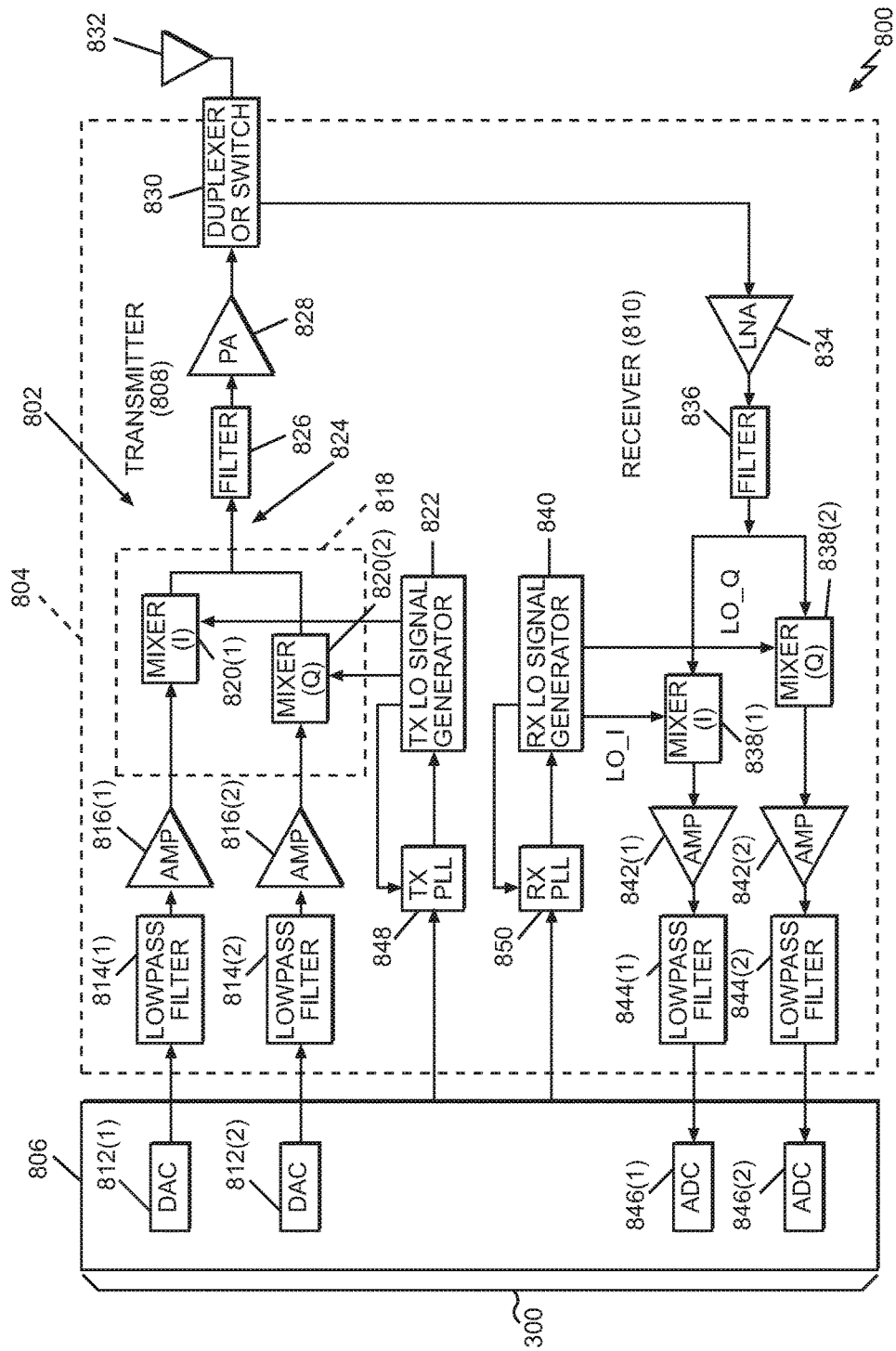
FIG. 8 is a block diagram of an exemplary wireless communications device that includes radio frequency (RF) components formed in an IC, wherein the RF components can include ICs employing the interconnect layer of FIG. 3.

FIG. 8 illustrates an example of a wireless communications device 800 that includes radio frequency (RF) components formed in an IC, wherein the RF components can include ICs employing the interconnect layer 300 illustrated in FIG. 3. In this regard, the wireless communications device 800 may be provided in an IC 802. The wireless communications device 800 may include or be provided in any of the above-referenced devices, as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communication. In general, the wireless communications device 800 may include any number of transmitters and/or receivers for any number of communication systems and frequency bands. All or a portion of the transceiver 804 may be implemented on one or more analog ICs, RF ICs (RFICs), mixed-signal ICs, etc.

A transmitter or a receiver may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog-converters (DACs) 812(1) and 812(2) for converting digital signals generated by the data processor 806 into the I and Q analog output signals (e.g., I and Q output currents) for further processing.

Within the transmitter 808, lowpass filters 814(1) and 814(2) filter the I and Q analog output signals, respectively, to remove undesired signals caused by the prior digital-to-analog conversion. Amplifiers (AMPs) 816(1) and 816(2) amplify the signals from the lowpass filters 814(1) and 814(2), respectively, and provide I and Q baseband signals. An upconverter 818 upconverts the I and Q baseband signals with I and Q transmit (TX) local oscillator (LO) signals through mixers 820(1) and 820(2) from a TX LO signal generator 822 to provide an upconverted signal 824. A filter 826 filters the upconverted signal 824 to remove undesired signals caused by the frequency upconversion as well as noise in a receive frequency band. A power amplifier (PA) 828 amplifies the upconverted signal 824 from the filter 826 to obtain the desired output power level and provides a transmit RF signal. The transmit RF signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Downconversion mixers 838(1) and 838(2) mix the output of the filter 836 with I and Q RX LO signals (i.e., LO_I and LO_Q) from an RX LO signal generator 840 to generate I and Q baseband signals. The I and Q baseband signals are amplified by AMPs 842(1) and 842(2) and further filtered by lowpass filters 844(1) and 844(2) to obtain I and Q analog input signals, which are provided to the data processor 806. In this example, the data processor 806 includes analog-to-digital-converters (ADCs) 846(1) and 846(2) for converting the analog input signals into digital signals to be further processed by the data processor 806.

In the wireless communications device 800 in FIG. 8, the TX LO signal generator 822 generates the I and Q TX LO signals used for frequency upconversion, while the RX LO signal generator 840 generates the I and Q RX LO signals used for frequency downconversion. Each LO signal is a periodic signal with a particular fundamental frequency. A TX phase-locked loop (PLL) circuit 848 receives timing information from the data processor 806 and generates a control signal used to adjust the frequency and/or phase of the I and Q TX LO signals from the TX LO signal generator 822. Similarly, a RX PLL circuit 850 receives timing information from the data processor 806 and generates a control signal used to adjust the frequency and/or phase of the I and Q RX LO signals from the RX LO signal generator 840.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, semiconductor die, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method for forming metal line patterns in an interconnect layer of an integrated circuit (IC), comprising:
    exposing a photoresist layer disposed over a hardmask layer to a light provided by a light source to form a metal line pattern on the photoresist layer, the metal line pattern comprising a plurality of metal line templates corresponding to a plurality of tracks each substantially parallel to an axis;
    removing one or more sections of the photoresist layer corresponding to the metal line pattern such that the hardmask layer is exposed according to the metal line pattern;
    etching the hardmask layer corresponding to the metal line pattern to form a plurality of trenches in the hardmask layer corresponding to the plurality of metal line templates in the metal line pattern;
    removing the photoresist layer; and
    directionally etching the hardmask layer adjacent to a first end portion of at least one trench to extend a length of the at least one trench in a first direction along the axis.

2. The method of claim 1, further comprising directionally etching the hardmask layer adjacent to a second end portion of the at least one trench, the second end portion opposite of the first end portion, to extend the length of the at least one trench in a second direction opposite of the first direction along the axis.

3. The method of claim 1, wherein directionally etching the hardmask layer comprises directionally etching the hardmask layer such that one or more trenches are extended in the first direction along the axis such that a tip-to-tip distance between the first end portion of the one or more trenches corresponding to a track and an end portion of another trench corresponding to the track is reduced.

4. The method of claim 1, wherein exposing the photoresist layer disposed over the hardmask layer to the light comprises exposing the photoresist layer to a single exposure of an extreme ultra-violet (EUV) light provided by an EUV light source.

5. The method of claim 1, further comprising disposing a plurality of metal lines in each corresponding trench of the metal line pattern.

6. The method of claim 1, further comprising precluding formation of residual dummy metal lines in the metal line pattern.

7. The method of claim 5, further comprising connecting one or more active elements within an IC using at least some of the plurality of metal lines.

8. A method for forming metal line patterns in an interconnect layer of an integrated circuit (IC), comprising:
    exposing a photoresist layer disposed over a hardmask layer to a light provided by a light source to form a metal line pattern on the photoresist layer, the metal line pattern comprising a plurality of metal line templates corresponding to a plurality of tracks each substantially parallel to an axis;
    removing one or more sections of the photoresist layer corresponding to the metal line pattern such that the hardmask layer is exposed according to the metal line pattern;
    directionally etching at least one metal line template of the plurality of metal line templates of the photoresist layer to extend a length of the at least one metal line template in a first direction along the axis;
    etching the hardmask layer corresponding to the metal line pattern to form a plurality of trenches in the hardmask layer corresponding to the plurality of metal line templates in the metal line pattern; and
    removing the photoresist layer.

9. The method of claim 8, further comprising directionally etching the hardmask layer adjacent to an end portion of at least one trench of the plurality of trenches in a second direction opposite of the first direction along the axis.

10. The method of claim 8, further comprising directionally etching at least a second metal line template of the plurality of metal line templates of the photoresist layer in a second direction opposite of the first direction along the axis.

11. The method of claim 8, wherein exposing the photoresist layer disposed over the hardmask layer to the light comprises exposing the photoresist layer to a single exposure of an extreme ultra-violet (EUV) light provided by an EUV light source.

12. The method of claim 8, further comprising disposing a plurality of metal lines in each corresponding trench of the metal line pattern.

13. The method of claim 8, further comprising precluding formation of residual dummy metal lines in the metal line pattern.

14. The method of claim 12, further comprising connecting one or more active elements within an IC using at least some of the plurality of metal lines.

* * * * *